(12) United States Patent
Cheng et al.

(10) Patent No.: US 10,903,332 B2
(45) Date of Patent: Jan. 26, 2021

(54) FULLY DEPLETED SOI TRANSISTOR WITH A BURIED FERROELECTRIC LAYER IN BACK-GATE

(71) Applicant: International Business Machines Corporation, Armonk, NY (US)

(72) Inventors: Kangguo Cheng, Schenectady, NY (US); Shawn P. Fetterolf, Cornwall, VT (US); Terence B. Hook, Jericho, VT (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/108,229

(22) Filed: Aug. 22, 2018

(65) Prior Publication Data
US 2020/0066867 A1 Feb. 27, 2020

(51) Int. Cl.
| H01L 29/51 | (2006.01) |
| H01L 27/12 | (2006.01) |
| H01L 29/78 | (2006.01) |
| H01L 21/762 | (2006.01) |
| H01L 29/66 | (2006.01) |
| H01L 21/02 | (2006.01) |

(52) U.S. Cl.
CPC ...... *H01L 29/516* (2013.01); *H01L 21/02181* (2013.01); *H01L 21/76251* (2013.01); *H01L 27/1203* (2013.01); *H01L 29/517* (2013.01); *H01L 29/66484* (2013.01); *H01L 29/7831* (2013.01)

(58) Field of Classification Search
CPC combination set(s) only.
See application file for complete search history.

(56) References Cited

U.S. PATENT DOCUMENTS

| 6,646,307 | B1 | 11/2003 | Yu et al. |
| 7,018,873 | B2 | 3/2006 | Dennard et al. |
| 7,537,978 | B2 | 3/2009 | Yagishita et al. |
| 7,772,647 | B2 | 8/2010 | Anderson et al. |
| 8,030,145 | B2 | 10/2011 | Chang et al. |
| 9,490,007 | B1* | 11/2016 | Chan ............ G11C 11/419 |
| 2004/0009649 | A1* | 1/2004 | Kub ............ B82Y 30/00 438/459 |

(Continued)

OTHER PUBLICATIONS

Es-Sakhi, Thesis Paper—"Silicon on Ferroelectric Insulator Field Effect Transistor (SOhttps://moFFET): A Radical Alternative to Overcome the Thermionic Limit", University of Missouri Kansas City, USA 2013 Kansas City, Missouri, 203 Pages.

*Primary Examiner* — Nduka E Ojeh
(74) *Attorney, Agent, or Firm* — Cantor Colburn LLP; Randall Bluestone

(57) ABSTRACT

Provided are techniques for generating fully depleted silicon on insulator (SOI) transistor with a ferroelectric layer. The techniques include forming a first multi-layer wafer comprising a semiconductor layer and a buried oxide layer, wherein the semiconductor layer is formed over the buried oxide layer. The techniques also including forming a second multi-layer wafer comprising the ferroelectric layer, and bonding the first multi-layer wafer to the second multi-layer wafer, wherein the bonding comprises a coupling between the buried oxide layer and the second multi-layer wafer.

7 Claims, 7 Drawing Sheets

(56) References Cited

U.S. PATENT DOCUMENTS

| | | | |
|---|---|---|---|
| 2005/0068822 A1* | 3/2005 | Kijima | H01L 27/12 365/202 |
| 2011/0108943 A1* | 5/2011 | Dennard | H01L 21/84 257/506 |
| 2012/0112207 A1* | 5/2012 | Cheng | H01L 29/78603 257/77 |
| 2013/0099303 A1* | 4/2013 | Huang | H01L 29/66833 257/324 |
| 2018/0053832 A1* | 2/2018 | Beyer | H01L 29/4908 |
| 2019/0181035 A1* | 6/2019 | Schwarzenbach | H01L 21/76254 |
| 2019/0181264 A1* | 6/2019 | Cheng | H01L 27/1203 |

* cited by examiner

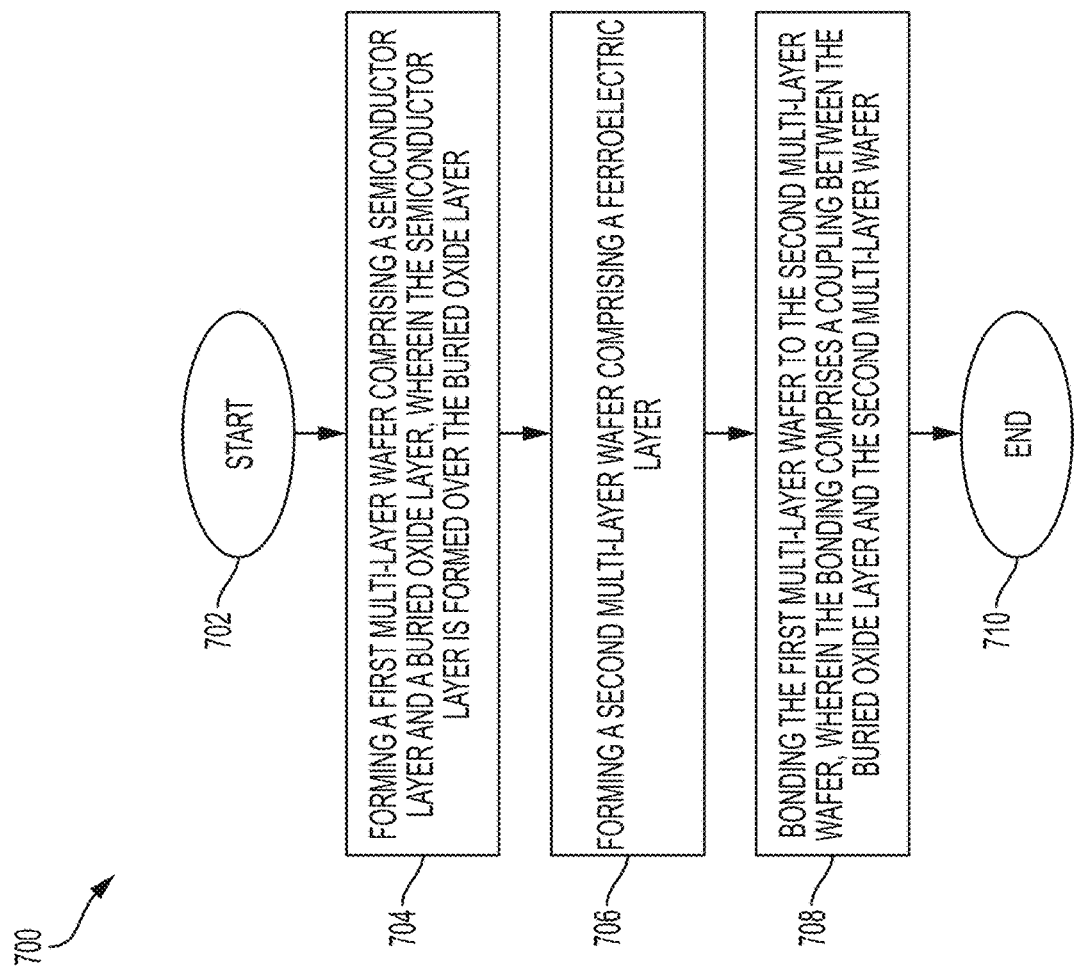

US 10,903,332 B2

FULLY DEPLETED SOI TRANSISTOR WITH A BURIED FERROELECTRIC LAYER IN BACK-GATE

BACKGROUND

The present invention generally relates to fabrication methods and resulting structures for semiconductor devices, and more specifically, to fabrication methods and resulting structures for a fully depleted semiconductor on insulator (FDSOI) transistor with a buried ferroelectric layer in back-gate.

In an integrated circuit (IC) having a plurality of metal oxide semiconductor field effect transistors (MOSFETs), each MOSFET has a source and a drain that are formed in an active region of a semiconductor layer by incorporating n-type or p-type impurities in the layer of semiconductor material. A conventional geometry for MOSFETs is known as a planar device geometry in which the various parts of the MOSFET device are laid down as planes or layers.

Fully depleted silicon-on-insulator (FDSOI) is a MOSFET fabrication technology that provides the benefits of reduced size while enabling a simplification of the fabrication process. FDSOI does not change the fundamental geometry of the MOSFET. However, a distinguishing feature of FDSOI technology is the addition of a thin layer of insulator called the buried oxide (BOX) layer, which is positioned just below an ultra-thin body/layer of silicon that forms the channel. This FDSOI channel configuration is often referred to as ultra-thin body and BOX (UTBB). The silicon channel layer is so thin that the channel is "fully depleted," with no neutral region. The result is that the gate of an FDSOI transistor very tightly controls the full volume of the transistor body. A feature of FDSOI transistors is the ability to provide a back-gate contact in the silicon substrate, wherein the BOX layer and the back-gate contact form, in effect, a transistor back-gate that can be biased in order to shift the FDSOI transistor's threshold voltage $V_T$. The efficacy of the back-gate depends on the effective thickness and dielectric constant of the BOX layer.

SUMMARY

Embodiments of the invention include techniques for generating fully depleted SOI transistor with a buried ferroelectric layer in the back-gate. The techniques include forming a first multi-layer wafer comprising a semiconductor layer and a buried oxide layer, wherein the semiconductor layer is formed over the buried oxide layer. The techniques also include forming a second multi-layer wafer comprising a ferroelectric layer, and bonding the first multi-layer wafer to the second multi-layer wafer, wherein the bonding comprises a coupling between the buried oxide layer and the second multi-layer wafer.

Embodiments of the invention are directed to a fully depleted SOI transistor with a buried ferroelectric layer in the back-gate including forming a fully depleted semiconductor on insulator device. The transistor device includes a buried dielectric layer coupled to a back-gate conductor layer, the back-gate conductor layer is coupled to a ferroelectric material layer that is coupled to a back-gate contact layer, a semiconductor layer coupled to the buried dielectric layer, the semiconductor layer including a source, a drain and a channel region between the source and the drain, and a gate insulator coupled to the channel region and coupled to a gate.

Embodiments of the invention are directed to a fully depleted SOI transistor with a buried ferroelectric layer in the back-gate including forming a fully depleted semiconductor on insulator device, the transistor device includes a first substrate including a conducting layer coupled to a ferroelectric material layer coupled to a back-gate contact layer, and a second substrate including a semiconductor layer over a buried oxide dielectric layer, wherein the first substrate is over the second substrate.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 7 depicts a flow diagram illustrating a method of forming a FDSOI transistor in accordance with one or more embodiments of the invention.

Figure 1:
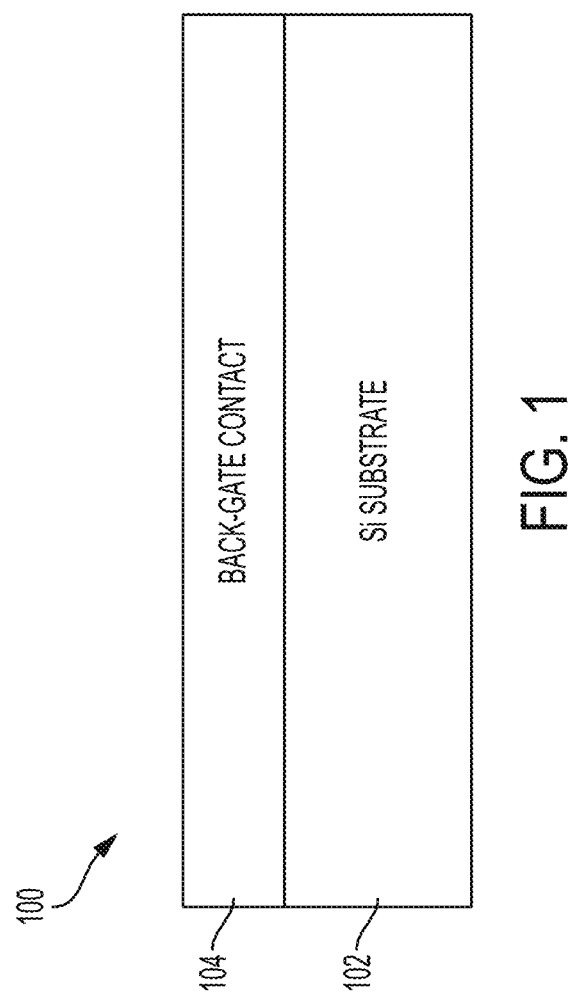
FIG. 1 is a cross-sectional view of a semiconductor structure after initial fabrication operations according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular FDSOI transistor architecture, embodiments of the invention are not limited to the particular FDSOI transistor architectures or materials described in this specification. Rather, embodiments of the present invention are capable of being implemented in conjunction with any other type of FDSOI transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, in a conventional bulk silicon planar transistor, two electrical terminals, namely the source and the drain, are built in the bulk silicon substrate. Dopants are often added to the substrate to improve the conductive properties of the silicon. The gate controls the flow of electrons between the source and the drain. When voltage is applied to the gate, a conductive channel is formed between the source and the drain, electric current flows from the source through the channel to the drain, and the transistor is in an "on" state. When voltage is removed from the gate, the flow of electrons from the source through the channel to the drain is turned off, and the transistor is in and "off" state. The transistor thus acts as a switch.

As the size of a planar transistor is reduced, the length dimension of the gate is also reduced, which in turn lowers the transistor's performance by reducing the control the gate exercises over the channel region. Reducing the size of a conventional bulk silicon transistor also increases the amount of unwanted leakage current that flows through the bulk silicon substrate even when the transistor is switched off, and increased leakage current increases the transistor's power consumption. In order to minimize leakage currents while continuing to deliver high performance, bulk silicon transistors have become more complex, this adding fabrication complexity at an increasing rate.

In contrast to conventional bulk silicon transistors, FDSOI is a semiconductor fabrication technology that provides the benefits of reduced silicon geometries while enabling a simplification of the fabrication process. Unlike many approaches to reducing a transistor's footprint, FDSOI does not change the fundamental geometry of the MOSFET. In FDSOI technology, a distinguishing feature is the addition of a thin layer (e.g., below about 25 nm) of insulator called the buried oxide (BOX) layer, which is positioned just below an ultra-thin body/layer of silicon that forms the channel. This FDSOI channel configuration is often referred to as ultra-thin body and BOX (UTBB).

A feature of FDSOI transistors is the ability to form a back-gate contact in the silicon substrate, wherein the BOX layer and the back-gate contact form, in effect, a transistor back-gate that can be biased in order to shift the FDSOI transistor's threshold voltage $V_T$. Accordingly, an FDSOI transistor can tune its threshold voltage and power management by applying a voltage below its BOX layer, which is a process known as "back-gating" or "back-biasing." However, a practical issue with FDSOI back-biasing is that it requires the above-described thin BOX layer to render the back biasing effective. Fabricating the thin BOX layer creates process and yield issues. For example, the thin BOX layer increases the potential for shorts to occur between source/drain (S/D) contacts and the back-gate due to the impact of the conduction properties of the channel layer between the S/D contacts caused by the back-gate voltage.

Turning now to an overview of aspects of the invention, one or more embodiments of the invention address the above-described shortcomings of the prior art by providing fabrication methods and resulting structures for FDSOI transistor devices having a relatively thick BOX region (e.g., from about 25 nm to about 50 nm) and enhanced back-gate tunability by using a ferroelectric insulator on the back-gate. In embodiments of the invention, fabrication complexity is reduced by forming the ferroelectric layer before final transistor formation and backside thinning. In embodiments of the invention, the ferroelectric layer is formed after forming a back-gate contact on a substrate but before forming a back-gate, a relatively thick BOX layer, a source, a drain, an FDSOI channel, a gate oxide, and a gate of the final transistor. In embodiments of the invention, the ferroelectric insulator is formed as part of the back-gate by wafer bonding before final transistor fabrication.

The above-described aspects of the invention address the shortcomings of the prior art by providing an efficient process and enhanced tunability of back-gates. In embodiments of the invention, the negative capacitance property of a ferroelectric insulator enables back biasing with a thick BOX and normal operating voltage. The normal operating voltage is the voltage that is required to switch the transistor, and by biasing the back-gate, the voltage at which the transistor switches can be adapted/controlled based on the biasing of the back-gate and the ferroelectric layer. The negative capacitance of the ferroelectric material allows for the enhanced tunability of the front-gate where the applied voltage is applied to switch the transistor. The ferroelectric layer can be used to recover and/or modulate the sensitivity at which the transistor switches due to the thick BOX. In one or more embodiments of the invention, the ferroelectric layer functions as a voltage amplifier/magnifier to tune the front-gate. In addition, the thick BOX reduces unwanted capacitive effects and increases the immunity to shorts between the source and drain contacts across the channel of the transistor. The techniques described herein provide for using the ferroelectric layer and back-gate biasing to tune the voltage at which the transistor switches impacting the voltage that has to be applied to the front-gate. The typical operating voltage of state-of-the-art semiconductors is less than one volt. With a thick BOX but without the ferroelectric layer the threshold voltage tuning range would be limited to about ten millivolts, but with the addition of the ferroelectric layer this can be increased to sixty millivolts or more, with a one volt back-bias.

Figure 3:
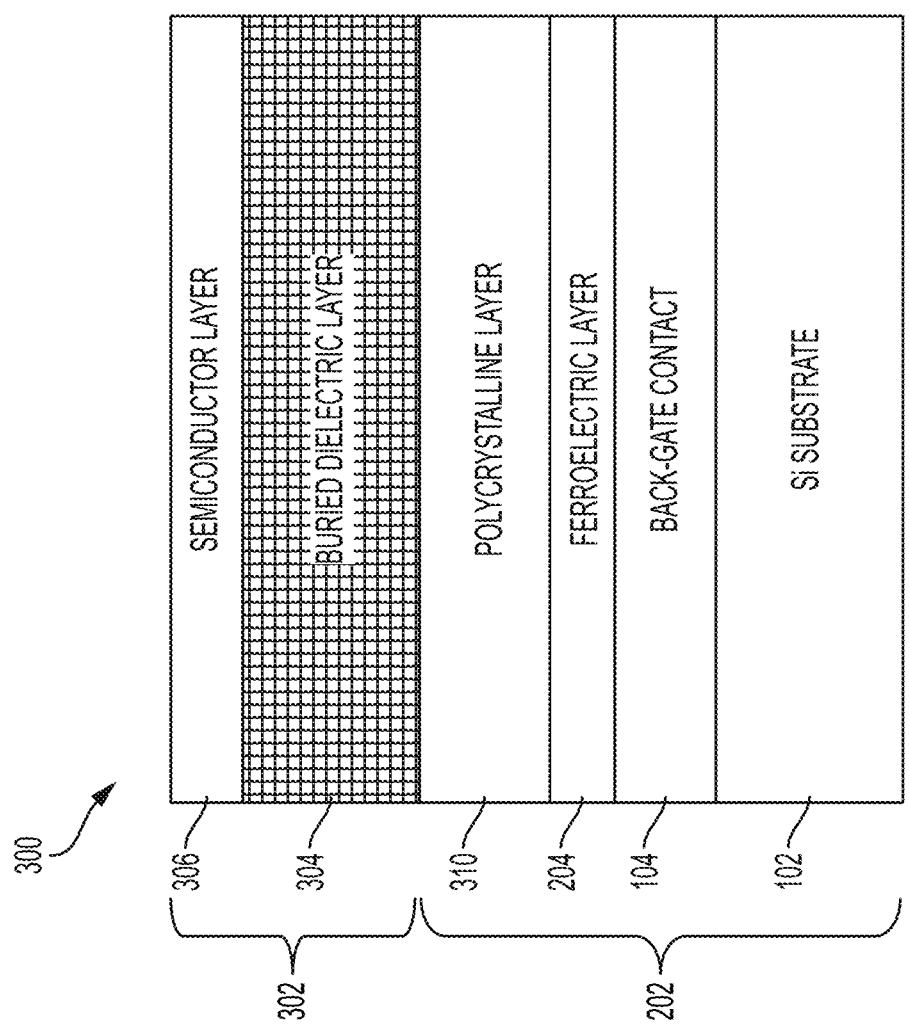
FIG. 3 is a cross-sectional view of the semiconductor structure after fabrication operations according to one or more embodiments of the invention.
Figure 4:
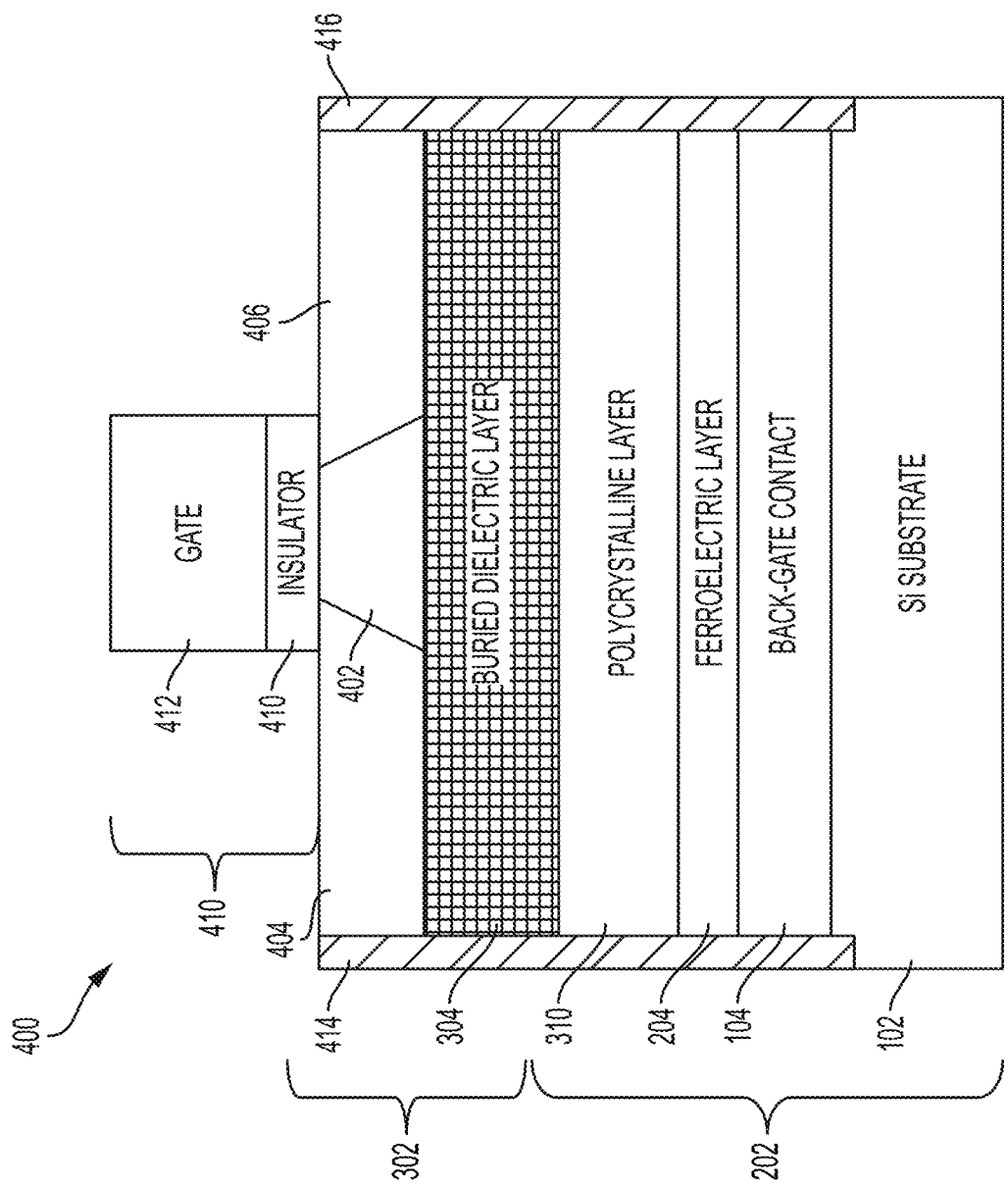
FIG. 4 is a cross-sectional view of the semiconductor structure after fabrication operations according to one or more embodiments of the invention.
Figure 5:
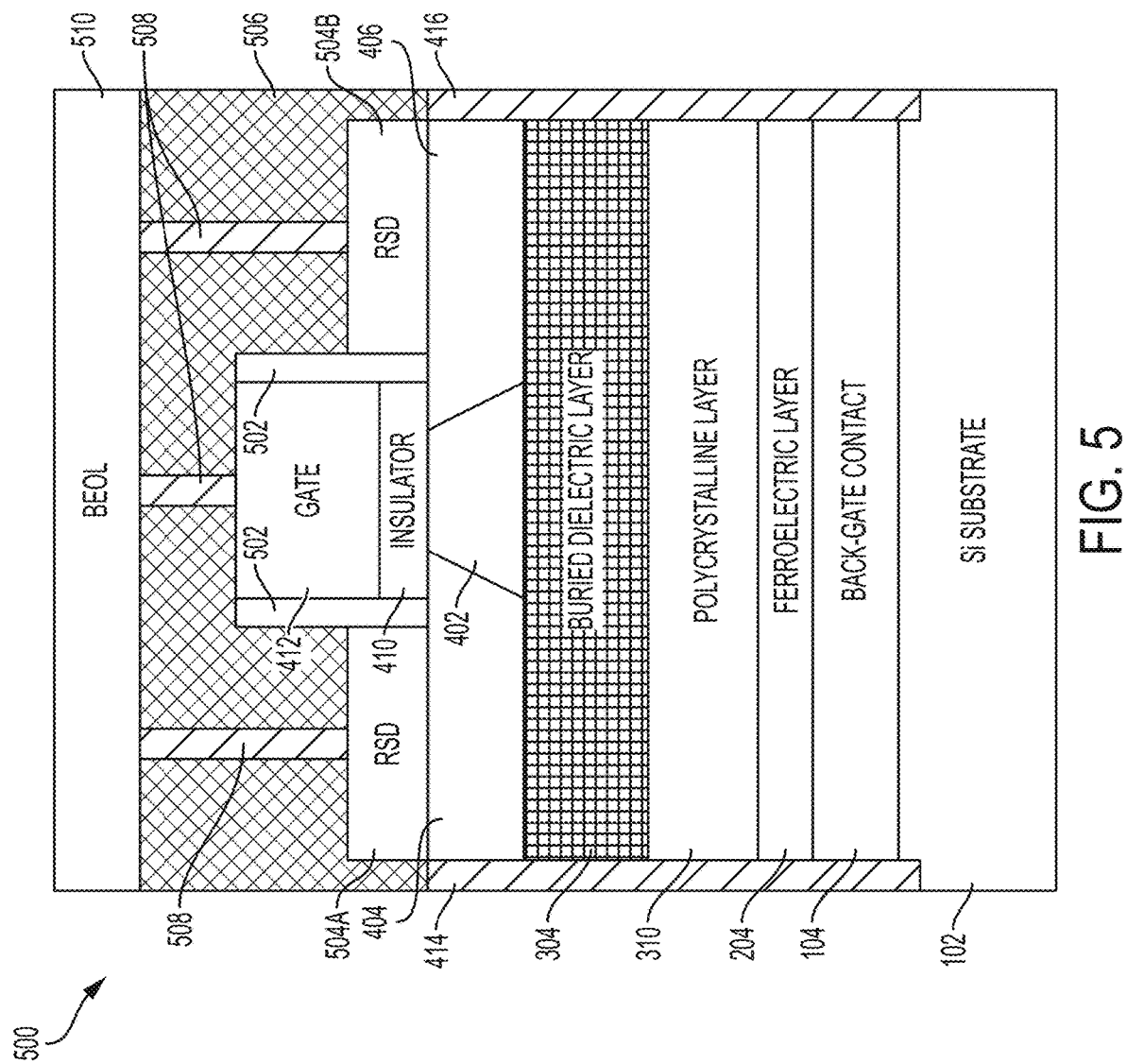
FIG. 5 is a cross-sectional view of the semiconductor structure after fabrication operations to form a fully depleted SOI transistor according to one or more embodiments of the invention.

Turning now to a more detailed description of aspects of the invention, FIGS. 1-5 illustrate various partially-fabricated structures 100, 200, 300, 400, and 500 after the application of process operations for fabricating an FDSOI transistor and/or interconnects 500 (shown in FIG. 5). Repetitive descriptions of like elements employed in illustrated embodiments of the invention have been omitted for sake of brevity. The components depicted in the figures are not to scale, including relative to one another.

In FIG. 1, known semiconductor fabrication operations have been used to form a partially fabricated semiconductor device 100 having a substrate 102 and a back-gate contact layer 104. In embodiments of the invention, the back-gate contact layer 104 can be formed from, for example, a metal, a conductive metallic, a compound, a doped semiconductor, or any suitable combination of those materials. In embodiments of the invention, the back-gate contact layer 104 can be deposited and/or grown on the substrate 102. Substrate 102 of the semiconductor device 100 can be formed from any suitable material such as a bulk substrate. In embodiments of the invention, the suitable material includes a support wafer of silicon, silicon dioxide, aluminum oxide, and the like.

In embodiments of the invention, the substrate 102 can be a semiconductor or an insulator with an active surface semiconductor layer. The substrate 102 can be crystalline, semi-crystalline, microcrystalline, or amorphous. The substrate 102 can be essentially (i.e., except for contaminants) a single element (e.g., silicon), primarily (i.e., with doping) of a single element, for example, silicon (Si) or germanium (Ge), or the substrate 102 can include a compound, for example, $Al_2O_3$, $SiO_2$, GaAs, SiC, or SiGe. The substrate 102 can also have multiple material layers, for example, a semiconductor-on-insulator substrate (e.g., SeOI), a silicon-on-insulator substrate (e.g., SOI), germanium-on-insulator substrate (e.g., GeOI), or silicon-germanium-on-insulator substrate (e.g., SGOI). The substrate 102 can also have other layers forming the substrate 102, including high-k oxides and/or nitrides. In one or more embodiments, the substrate 102 can be a silicon wafer. In an embodiment, the substrate 102 is a single crystal silicon wafer. An example, non-limiting thickness of substrate 102 is typically in the range of hundreds to thousands of micrometers.

Figure 2:
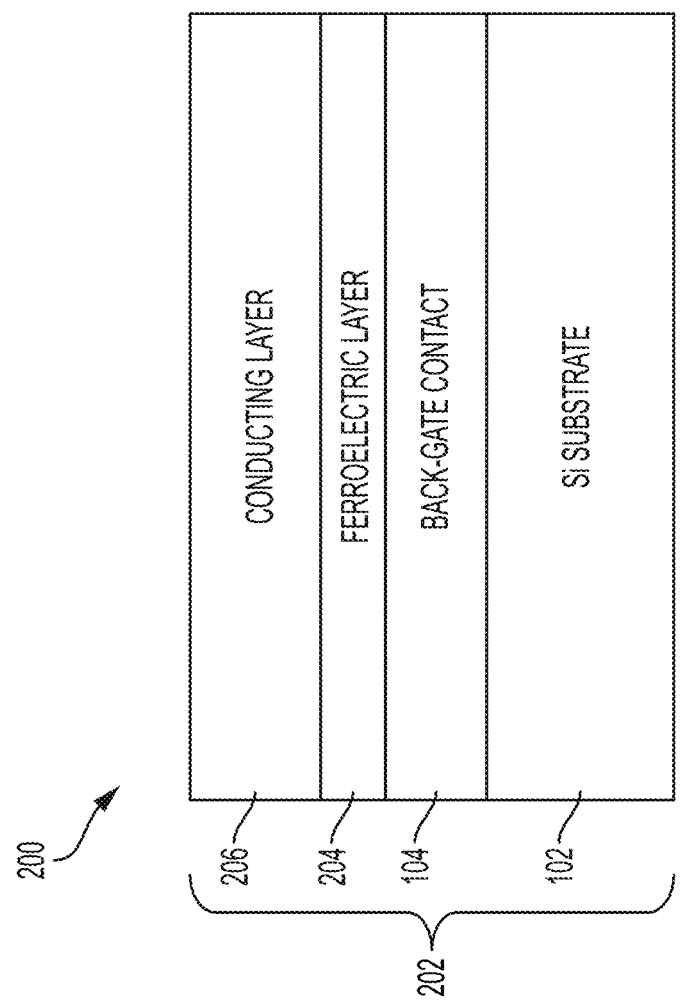
FIG. 2 is a cross-sectional view of the semiconductor structure after fabrication operations according to one or more embodiments of the invention.

In FIG. 2, known semiconductor fabrication operations have been used to form a partially fabricated semiconductor device 200 by forming a ferroelectric layer 204 over the back-gate contact layer 104, and by forming a conducting layer 206 over the ferroelectric layer 204. In some embodiments, the conducting layer 206 includes amorphous silicon doped with dopants such as n-type dopants (phosphorus, arsenic, antimony) or p-type dopants (boron, gallium). The conducting layer 206 can include other materials such as polycrystalline silicon, amorphous silicon germanium, polycrystalline silicon germanium. Non-limiting techniques for forming the ferroelectric layer 204 and the amorphous conducting layer 206 can include, for example, chemical vapor deposition (CVD), physical vapor deposition (PVD), atomic layer deposition (ALD), sputtering, plating, evaporation, spin-on-coating, ion beam deposition, electron beam deposition, laser assisted deposition, chemical solution deposition, or any combination of those methods.

As a result of the deposition operations depicted in FIG. 2, a multi-layer wafer 202 is formed that includes the substrate 102, the back-gate contact layer 104, the ferroelectric layer 204, and the amorphous layer 206. In embodiments of the invention, the ferroelectric material 204 can be formed from hafnium oxide, with a thickness on the order of 200 nm, and a dielectric constant on the order of 20. Non-limiting thicknesses of the layers 104, 204 and 206 can range from 10 nm to 200 nm. In accordance with aspects of the invention, the negative capacitance property of the ferroelectric material layer 204 inserted into the back-gate stack (i.e., the multi-layer wafer 202) between the back-gate conductor layer (amorphous layer 206) and the back-gate contact layer 104 enables back biasing with the thick buried dielectric layer 304 (shown in FIG. 3) using a normal operating voltage, thereby providing enhanced back-gate tunability.

Non-limiting examples of ferroelectric materials for forming the ferroelectric layer 204 can include, for example, inorganic complex oxide and fluoride ferroelectrics, e.g., hafnium oxide, hafnium zirconium oxide ($HfZrO_2$), lead zirconate titanate (PZT), $SrBa_2Ta_2O_9$, $PbZrTiO_3$, $Bi_4La_xTi_{3-x}O_{12}$ or $BiMgF_4$, ferroelectric polymers, such as polyvinylidene fluoride (PVDF) and its copolymers with, e.g., trifluoroethylene, P(VDF-TrFE). Example non-limiting thicknesses of the ferroelectric layer can range from about 50 nm to about 500 nm.

Non-limiting examples of materials for forming the back-gate conducting layers (i.e., when the conducting layer 206 starts with amorphous silicon, it transition to polycrystalline layer 310 after thermal processing) can include, for example, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further comprise dopants that are incorporated during or after deposition.

In FIG. 3, known semiconductor fabrication operations have been used to form a partially fabricated semiconductor structure 300 after the multi-layer wafer 202 has been bonded to a multi-layer wafer 302. As a result of bonding the multi-layer wafer 202 to the multi-layer wafer 302, the amorphous layer 206 (shown in FIG. 2) has transitioned to a polycrystalline layer 310. The multi-layer wafer 302 includes a buried dielectric layer 304 and a semiconductor layer acting as a substrate 306, configured and arranged as shown. In one or more embodiments of the invention, a second bulk silicon is provided where the buried dielectric layer 304 is grown. The buried dielectric layer 304 can be formed from any suitable dielectric material such as a buried oxide (or BOX), which can have a thickness ranging from about 25 nanometers (nm) to about 100 nm. In embodiments of the invention, the thin semiconductor layer 306 can be formed from approximately 10 nm of silicon. Examples of suitable materials for the thick buried dielectric layer 304 include a buried oxide (BOX) with a thickness on the order of 25 nm to 50 nm and a BOX dielectric constant on the order of 3.9. As is known, other materials (e.g., laminated insulators) and thicknesses can be used instead of or in addition to the examples described herein, and none of the examples are to be considered limiting.

In another embodiment of the invention, the structure 300 of FIG. 3 is formed by the following process. First, a second semiconductor substrate such as silicon is provided. A dielectric layer is formed on top of the second substrate, for example, the dielectric layer being silicon oxide formed by thermal oxidation. Optionally, another dielectric layer can be formed on top of the conducting layer 206 in the first substrate. For example, the conducting layer 206 can be amorphous silicon and the dielectric layer can be silicon oxide formed by thermal oxidation of a portion of the amorphous silicon. Depending on the thermal oxidation temperature, the remaining portion of the amorphous silicon can crystallize and transition into polycrystalline silicon. Next, the two substrates (both having silicon oxide at their surfaces) are bonded together by oxide-to-oxide bonding. A thermal annealing can be performed to strengthen the bonding interface. Again, the amorphous material in the conducting layer 206 can crystallize during this thermal anneal process. The semiconductor substrate can be thinned, resulting in the semiconductor layer 306 which will serve as the fully depleted SOI layer. The thinning of the second substrate after wafer bonding can be done by grinding, polishing, chemical etching, SmartCut® processing (SmartCut processing is owned by Soitec), and any suitable combination of those techniques.

The buried dielectric layer 304 can be formed from silicon oxide, silicon nitride, silicon oxynitride, boron nitride, SiOCN, SiBCN, SiOC, SiCN, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. Example, non-limiting buried dielectric layer 304 thicknesses range from about 25 nm to about 100 nm.

The buried dielectric layer 304 is referred to herein as "thick" to contrast the thick buried dielectric layer 304 with thinner buried dielectric layers used in known FDSOI device architectures. More particularly, one or more embodiments of the FDSOI transistor technology can have the capability of tuning transistor threshold voltage, and thus power management, by back gating (e.g., applying a voltage below the thick buried dielectric layer 304). The technology described herein is directed to an FDSOI transistor with enhanced back biasing tunability, via a relatively thick buried dielectric layer, and thus one or more embodiments can avoid or reduce the likelihood of experiencing drawbacks of a thinner BOX layer (for example, potential shorts between source/drain contacts to the back-gate that can result from the thinness of the BOX layer). Unwanted capacitance can cause charges to build up in the channel region of the transistor and cause shorts between the source/drain contacts. A thicker BOX reduces the unwanted capacitance effects on the channel region and reduces the likelihood that a short between the source and drain occurs.

The semiconductor layer 306 is an FDSOI layer which can include silicon, germanium, silicon germanium, silicon carbide, and those materials including or being III-V compound semiconductors and/or II-VI compound semiconductors. The semiconductor substrate can also include an organic semiconductor or a layered semiconductor such as, for example, Si/SiGe, a silicon-on-insulator or a SiGe-on-insulator. A portion or entire semiconductor layer 306 can be amorphous, polycrystalline, or monocrystalline. In addition to the aforementioned types of semiconductor layer 306, the semiconductor layer 306 employed in the present embodiments of the invention can also include a hybrid oriented (HOT) semiconductor substrate in which the HOT substrate has surface regions of different crystallographic orientation. The semiconductor substrate can be doped, undoped or contain doped regions and undoped regions therein. The semiconductor layer 306 can contain regions with strain and regions without strain therein, or contain regions of tensile strain and compressive strain. Example, non-limiting semiconductor layer 306 (i.e. FDSOI layer) thicknesses can range from about 2 nm to about 20 nm.

In FIG. 4, known semiconductor fabrication operations have been applied to the semiconductor structure 300 (shown in FIG. 3) to form a partially fabricated semiconductor structure 400. As shown in FIG. 4, a channel region 402, source 404 and a drain 406 have been formed in the semiconductor layer 306 of FIG. 3. The FDSOI channel is represented as an FDSOI channel region 402. The steps for defining the active area (channel region 402, source region 404, and drain region 406) can include formation of a pad oxide layer, for example, by oxidation of the surface layer of the semiconductor layer 306 and deposition of a pad nitride layer. The steps for defining the active area can further include application of a photoresist and lithographic patterning of the active area by which the photoresist covers the active area, removal of exposed portions of the semiconductor layer 306 at least to an upper surface of the buried insulator layer 304, removal of the photoresist, optional deposition of a shallow trench isolation (STI) liner, deposition of an STI oxide, optional anneal for STI oxide densification, and planarization of the STI oxide, which can employ the pad nitride layer as a stopping layer.

The source 404 and drain 406, have been selectively doped to produce the doped source and drain regions of the semiconductor layer 306 (shown in FIG. 3). The source and drain regions can be doped using any suitable doping technique such as in-situ epitaxial growth, ion implantation, gas phase doping, plasma doping, plasma immersion ion implantation, cluster doping, infusion doping, liquid phase doping or solid phase doping, etc. Dopant types for silicon, silicon germanium, or germanium can be, for example, n-type dopant selected from a group of phosphorus (P), arsenic (As) and antimony (Sb), and a p-type dopant selected from a group of boron (B), boron fluoride (BF2), gallium (Ga), indium (In), and thallium (Tl). An activation anneal is performed to activate dopants in the source and drain extension regions. In embodiments of the invention, the activation anneal can be a diffusionless anneal, such as, a laser anneal or a flash anneal, that avoids the loss of dopants in the source and drain extension regions into the buried oxide layer 304, which is an underlying back-gate oxide layer. The source/drain are typically formed after the formation of the gate (either a dummy gate which will be removed and replaced in a later process by a real gate (so-called "replacement metal gate" processing), or a real gate (so-called "gate-first" processing). Typically, spacers are formed on gate sidewalls to protect the gate during the formation of the source/drain.

In one or more embodiments of the invention, isolation regions 414 and 416 are formed to electrically isolate the structure 400 from other regions or devices formed on the Si substrate 102. For example, the isolation regions 414, 415 can be formed as shallow trench isolation (STI) regions by etching a trench (as described above) in the partially-fabricated structure 400 and filling the trench with STI material (e.g., a dielectric).

Referring still to FIG. 4, known fabrication operations have been used to form a gate structure 408 having a gate insulator 410 and gate conductor 412. In one or more embodiments of the invention, the gate insulator 410 has been deposited on semiconductor layer 306 including the source 404, drain 406, and channel region 402. Next the gate conductor 412 has been deposited on the gate insulator 410. In one or more embodiments of the invention, the gate can be a real gate, meaning the same gate in the final structure. Alternatively, the gate can be a dummy gate which will be removed and replaced later by a real gate (so-called "replacement metal gate" processing). The gate can be formed by any suitable patterning technique (e.g., lithography followed by etching) after the deposition of the gate stack.

The gate insulator 410 (i.e. a gate dielectric) is formed over portions of the channel region 402, source 404, and drain 406, and the gate insulator 410 is shown as being over this channel region 402. The gate insulator 410, by way of example and not limitation, can be formed from silicon oxide, silicon nitride, silicon oxynitride, boron nitride, SiOCN, SiBCN, SiOC, SiCN, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum, magnesium. In some embodiments, the gate insulator 408 can include a combination of the above materials. Example non-limiting thicknesses can range from 1 nm to 5 nm.

In one or more embodiments of the invention, the gate conductor 412 is formed over the gate insulator layer 410. The gate conductor 412, by way of example and not limitation, can include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition.

The gate conductor 412 can further include a work function setting layer. The work function setting layer can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, the gate is comprised of a conductor material which serves as the gate conductor and work function setting layer. Non-limiting vertical height range of the gate conductor 412 can be 20 nm to 100 nm. Non-limiting lateral width of gate conductor 412 can range from 10 nm to 100 nm. The gate conductor 412 can further include a dielectric cap (not shown).

In FIG. 5, more detailed device structure is shown. In one or more embodiments of the invention, spacers 502 are formed on sidewalls of the gate structure 414, generally to protect the gate structure 408 where the gate structure 408 refers to the gate insulator 410 and gate 412. The spacers 502, by way of example and not limitation, can include silicon oxide, silicon nitride, silicon oxynitride, boron nitride, SiOCN, SiBCN, SiOC, SiCN, high-k materials, or any suitable combination of those materials. Example non-limiting thicknesses can range from 3 nm to 10 nm.

In one or more embodiments of the invention, raised source/drain (RSD) regions 504A, 504B is formed on at least a portion of the source 404 and drain 406. The RSD regions are typically formed by an epitaxial growth process. Epitaxial materials can be grown from gaseous or liquid precursors. Epitaxial materials can be grown using vapor-phase epitaxy (VPE), molecular-beam epitaxy (MBE), liquid-phase epitaxy (LPE), rapid thermal chemical vapor deposition (RTCVD), metalorganic chemical vapor deposition (MOCVD), ultrahigh vacuum chemical vapor deposition (UHVCVD), low-pressure chemical vapor deposition (LPCVD), limited reaction processing chemical vapor deposition (LRPCVD), or other suitable process. Epitaxial silicon, silicon germanium (SiGe), germanium (Ge) and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $3\times10^{21}$ cm$^{-3}$, or preferably between $2\times10^{20}$ cm$^{-3}$ to $3\times10^{21}$ cm$^{-3}$. Example non-limiting thicknesses can range from 10 nm to 50 nm. In addition to in-situ doping (adding dopants into source/drain during epitaxy growth of RSD), other doping technique can be used, or any suitable combination of any of those doping techniques can be used to form source/drain (source/drain including RSD portion). Other doping techniques can include any of in-situ doping, ion implantation, gas phase doping, plasma doping, plasma immersion ion implantation, cluster doping, infusion doping, liquid phase doping, solid phase doping, etc.

Referring still to FIG. 5, interlayer dielectric (ILD) regions 506 have been formed. Note that for simplicity, only one portion of the ILD 506 that appears in FIG. 5 is labeled as ILD 506. In embodiments of the invention, the ILD regions 506 can be formed by depositing a layer of ILD material such as silicon oxide, silicon nitride, silicon oxynitride, carbon doped silicon oxide, fluorine doped oxide, low-k dielectric, or any suitable combination of those materials. After depositing the ILD 506, the ILD material 506 can be patterned and etched, in accordance with known fabrication techniques to form trenches (not shown) to form contacts 508. The trenches are filled with conductive contact material to form the contacts 508. The back-end-of-line (BEOL) wiring 510 is formed over the ILD regions 506 and the contacts 508 in a generally known manner.

Figure 6:
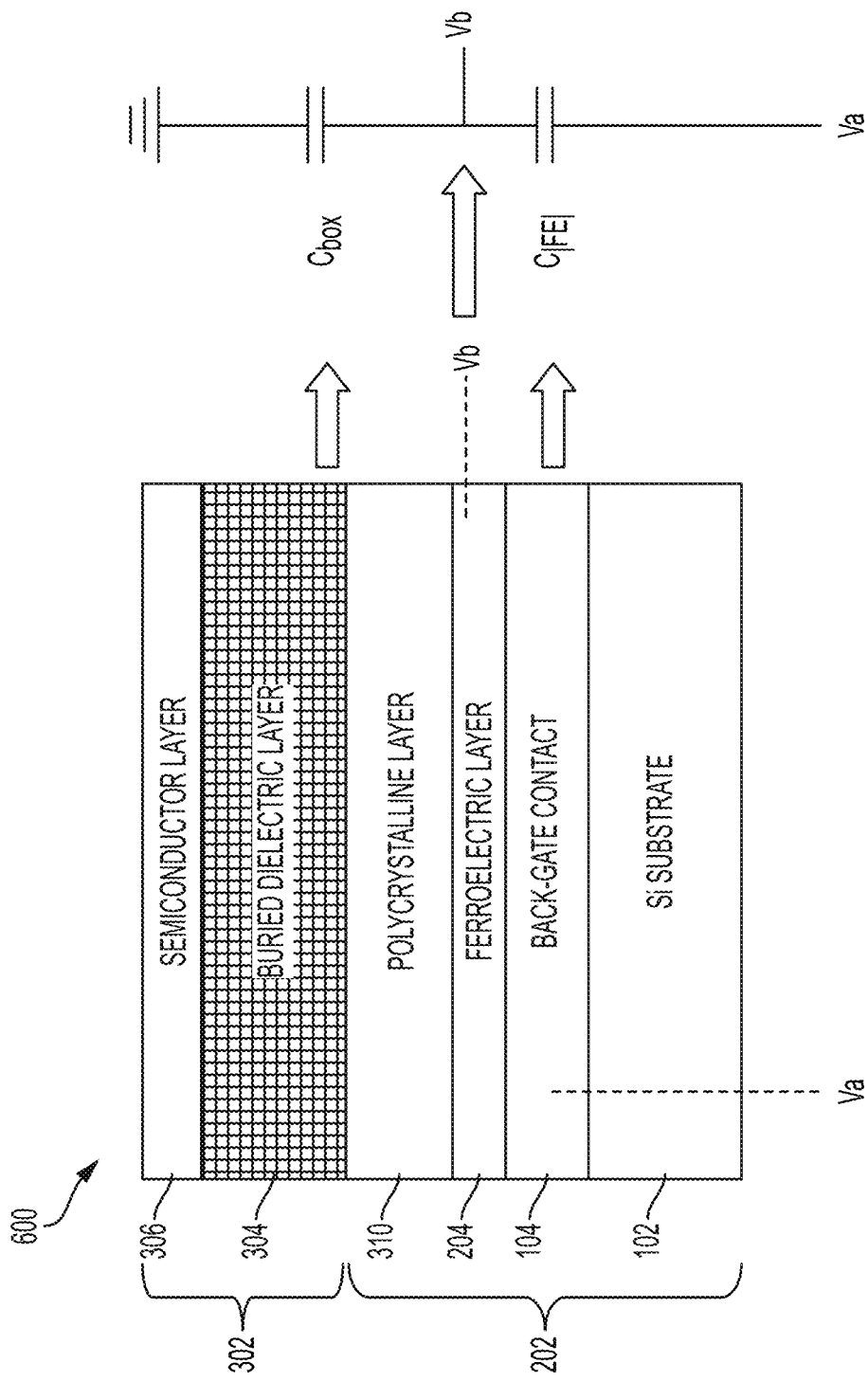
FIG. 6 depicts a cross-sectional view of the semiconductor structure depicted in FIG. 3 showing voltages at relevant locations according to one or more embodiments of the invention.

In FIG. 6, a portion of the semiconductor structure 500 of FIG. 5 is shown, where the structure 600 of FIG. 6 represents electrical properties of the semiconductor structure 500 with a ferroelectric material having been inserted into the back-gate stack of semiconductor structure 500. In general, when a voltage $V_a$ is applied to the back-gate contact layer 104, there is a voltage gain on the back-gate conductor layer (polycrystalline layer 310) as a result of the negative capacitance of the ferroelectric material layer 204. In other words, the effective back-gate voltage $V_b$ is greater than the applied voltage $V_a$.

The voltage gain, $A_v$, can be determined as below:

$$(A_v)=V_b/V_a=|C_{FE}|/(|C_{FE}|-|C_{BOX}|)=1/(1-|C_{BOX}|/|C_{FE}|)$$

where $C_{BOX}$ is the BOX capacitance (or the capacitance of the thick buried dielectric layer 304 if other than buried oxide) and $|C_{FE}|$ is the absolute value of the ferroelectric capacitance. Note that FIG. 6 includes a circuit-like representation illustrating the capacitances ($|C_{FE}|$ and $C_{BOX}$) and voltages ($V_a$ and $V_b$).

By way of example, consider a buried oxide (BOX) layer with a thickness of 50 nm (which provides much wider process/yield windows than a 25 nm BOX layer thickness). In this example, the BOX dielectric constant can be 3.9, along with a ferroelectric material of hafnium oxide, with a thickness of 200 nm, and a dielectric constant of approximately 20. Note that in such an example the ferroelectric material layer is thus three times the thickness of the BOX layer, but to reiterate, neither the drawings nor any of the components depicted therein are intended to be to scale herein, including to scale relative to one another.

Using the above voltage gain calculation, with $|C_{BOX}|/|C_{FE}| \sim 0.8$, $A_v=4$, i.e., 5 times voltage gain with 50 nm BOX. Without a ferroelectric material, a 50 nm BOX provides a back-gate tunability of half that of a 25 nm BOX case. With a ferroelectric material, the 50 nm BOX provides a (approximately) 2.5 times improvement in back-gate bias tunability compared with a 25 nm BOX layer.

FIG. 7 shows a method 700 for forming a fully depleted semiconductor on insulator device in accordance with one or more embodiments of the invention, with operations provided as method steps. The method 700 begins at step 702 and continues to step 704 which includes forming a first multi-layer wafer comprising a semiconductor layer and a buried oxide layer, wherein the semiconductor layer is formed over the buried oxide layer. The method 700 at step 706 includes forming a second multi-layer wafer comprising a ferroelectric layer. The method 700 proceeds to step 708 which includes bonding the first multi-layer wafer to the second multi-layer wafer, wherein the bonding comprises a coupling between the buried oxide layer and the second multi-layer wafer. The method 700 ends at step 710.

According to yet another embodiment, a semiconductor device (e.g., a fully depleted semiconductor on insulator transistor) can include a back-gate stack, the back-gate stack including a back-gate contact layer 104, a ferroelectric material layer 204 coupled to the back-gate contact layer 104, and a back-gate conductor layer (polycrystalline layer 310) coupled to the ferroelectric material layer 204. The semiconductor device can further include a buried dielectric layer 304 coupled to the back-gate conductor layer (polycrystalline layer 310) of the back-gate stack 202, a semiconductor layer coupled to the buried dielectric layer 304, the semiconductor layer including a source 404, a drain 406 and a channel region 402 between the source 404 and the drain 406, a gate insulator 410 coupled to the channel region 402 and a gate conductor 412 coupled to the gate insulator 410. The buried dielectric layer can include a buried oxide layer. The buried dielectric layer can have a thickness of greater than 25 nm. The buried dielectric layer can have a thickness of approximately 50 nm. The ferroelectric material layer can include hafnium oxide. The semiconductor device can include a contact coupled to the gate, back-end-of-line wiring coupled to the contact and a carrier coupled to the back-end-of-line wiring.

As can be seen, there is described a device structure, a semiconductor device structure, a fully depleted semiconductor on insulator transistor structure and a method for forming same with a relatively thick buried dielectric layer and enhanced back-gate tunability by using a ferroelectric insulator as part of a back-gate stack. The negative capacitance property of the ferroelectric insulator enables back biasing with the thick buried dielectric layer and normal operating voltages.

The techniques described herein provides a method and structure for forming FDSOI with a thick BOX and enhanced back-gate tunability by using a ferroelectric insulator on back-gate. Particularly, the ferroelectric insulator is formed as part of a back-gate wafer bonding, i.e., before transistor fabrication.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
   forming a first multi-layer wafer comprising a semiconductor layer and a buried oxide layer;
   wherein the semiconductor layer is formed over the buried oxide layer, wherein the buried dielectric layer is epitaxially grown on the first multi-layer wafer;
   forming a second multi-layer wafer comprising a ferroelectric layer and a back-gate contact layer, wherein the ferroelectric layer is formed on top of the back-gate contact layer, wherein the ferroelectric layer comprises hafnium oxide, wherein the back-gate contact layer is used to control a switching voltage of a device on the first multi-layer wafer; and
   bonding the first multi-layer wafer to the second multi-layer wafer;
   wherein the bonding comprises the buried oxide layer of the first multi-layer wafer is bonded in direct contact with a polycrystalline layer of the second multi-layer wafer, wherein the polycrystalline layer of the second multi-layer wafer directly contacts the ferroelectric layer of the second multi-layer wafer.

2. The method of claim 1 further comprising forming a conducting layer on the ferroelectric layer of the second multi-layer wafer.

3. The method of claim 2, wherein the bonding includes coupling the buried oxide layer of the first multi-layer wafer to the conducting layer of the second multi-layer wafer.

4. The method of claim 2, wherein the conducting layer comprises an amorphous silicon layer, and, responsive to the bonding, the amorphous silicon layer transitions to the polycrystalline layer.

5. The method of claim 1 further comprising forming a gate stack over the semiconductor layer of the first multi-layer wafer.

6. The method of claim 1 further comprising:
   forming a source, a drain and a channel region in the semiconductor layer;
   wherein the gate stack is over the channel region;
   wherein the gate stack comprises a gate insulator and a metal gate;
   wherein the gate insulator is coupled to the semiconductor layer and the metal gate is coupled to the gate insulator.

7. The method of claim 1, wherein the buried oxide layer has a thickness of approximately 50 nanometers.

* * * * *